United States Patent [19]

Matsuoka

[11] Patent Number: 5,420,501

[45] Date of Patent: May 30, 1995

[54] FREQUENCY SPECTRUM ANALYZER

[75] Inventor: Katsutoshi Matsuoka, Kanagawa, Japan

[73] Assignee: NSK Ltd., Tokyo, Japan

[21] Appl. No.: 189,714

[22] Filed: Feb. 1, 1994

[30] Foreign Application Priority Data

Feb. 1, 1993 [JP] Japan .................................. 5-036081

[51] Int. Cl.$^6$ ..................... G01R 23/02; G01R 23/165
[52] U.S. Cl. ................................ 324/76.21; 324/76.24;
324/76.38; 324/76.47; 324/76.28; 364/576;
364/577
[58] Field of Search ....................... 342/116, 196, 192;
364/485, 575, 576, 577; 382/52; 381/49, 50

[56] References Cited

U.S. PATENT DOCUMENTS

| | | | |
|---|---|---|---|
| 3,243,703 | 3/1966 | Wood | 324/76.46 |
| 3,439,269 | 4/1969 | Fuchs | 324/76.29 |
| 3,881,097 | 4/1975 | Lehmann | 324/76.21 |
| 3,984,669 | 10/1976 | Lehmann | 324/76.21 |
| 5,075,619 | 12/1991 | Said | 324/76.31 |
| 5,168,215 | 12/1992 | Puzzo | 324/76.29 |

FOREIGN PATENT DOCUMENTS

| | | |
|---|---|---|
| 56-90220 | 7/1981 | Japan . |
| 59-222728 | 12/1984 | Japan . |
| 61-124997 | 6/1986 | Japan . |
| 247563 | 2/1990 | Japan . |
| 2232494 | 12/1990 | United Kingdom . |

Primary Examiner—Kenneth A. Wieder
Assistant Examiner—Jose M. Solis
Attorney, Agent, or Firm—Sughrue, Mion, Zinn, Macpeak & Seas

[57] ABSTRACT

A frequency spectrum analyzer wherein an input signal is subjected to A/D conversion, and the converted data is multiplied by a window function; and the thus processed signal is subjected to Discrete Fourier Transform; when a user specifies a desired frequency, the square root of the sum of the squares of amplitudes of a predetermined number m of spectral lines close to the frequency is calculated; and the calculated value is outputted as a Root-Mean-Square value (RMS) of the amplitude of the spectrum of the frequency.

3 Claims, 6 Drawing Sheets

FREQUENCY SPECTRUM ANALYZER

BACKGROUND OF THE INVENTION

The present invention relates to a frequency spectrum analyzer for evaluating the frequency spectrum of an input signal with high accuracy by subjecting digital data corresponding to the input signal to Discrete Fourier Transform (DFT).

A conventional frequency spectrum analyzer is such that a series of digital data corresponding to an input signal (if the input signal is an analog signal, the digital data can be obtained after the input signal has been subjected to A/D conversion) is multiplied by a window function and then subjected to DFT; an absolute value of the converted complex number data is calculated; and the calculated value is displayed as a frequency spectrum at discrete frequency points.

According to the conventional frequency spectrum analyzer, when a user specifies desired frequency points, the frequency spectrum at the frequency points is displayed as a Root-Mean-Square value (hereinafter referred to as "RMS") of the amplitudes, or decibel values at the frequency points are displayed together with the frequency on the basis of a predetermined value at a reference frequency.

However, e.g., in the case where steady-state vibration of a rotating body is subjected to frequency analysis to evaluate the spectrum of a predetermined frequency using the conventional frequency spectrum analyzer, the numbers of rotations of the rotating body tend to be shifted due to some cause every time it is measured, so that the amplitudes of the spectrum are varied, thereby impairing the reliability of the measured values.

Figure 5A:
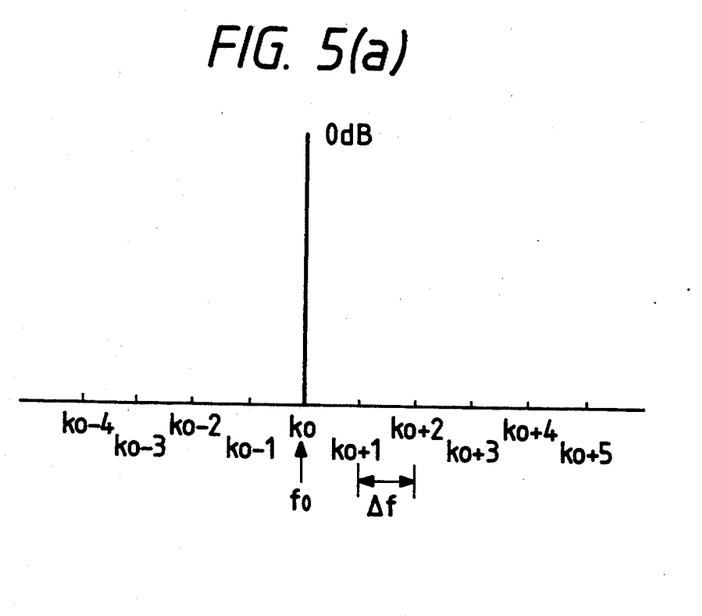
FIGS. 5(a) and 5(b) are diagrams showing an example of a spectrum in the case where a rectangular window is used.
Figure 5B:
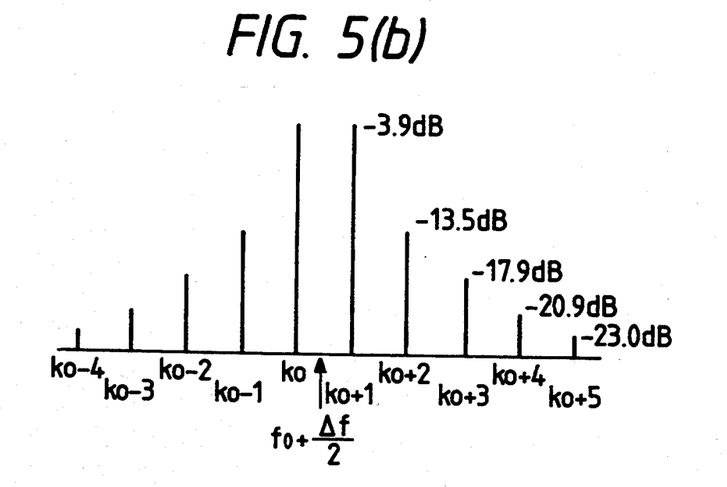

Specifically, e.g., in the case where a rectangular window is used as a window function, if a frequency f of an input signal coincides with a discrete frequency point k; i.e., if $f_0$ is the frequency corresponding to a frequency point $k=k_0$ as shown in FIG. 5(a), a single spectral line is observed when $f=f_0$. However, if the frequency f of the input signal does not coincide with the frequency point; e.g., the frequency f is varied to the midpoint $(f_0+\Delta f/2)$ between the frequency points, the spectrum of the frequency is dispersed into a plurality of spectral lines (hereinafter referred to as "leakage") as shown in FIG. 5(b), so that the amplitude of the spectrum at the target frequency point $k_0$ is undesirably reduced to 64% (−3.9 dB) of a precise value.

Figure 6A:
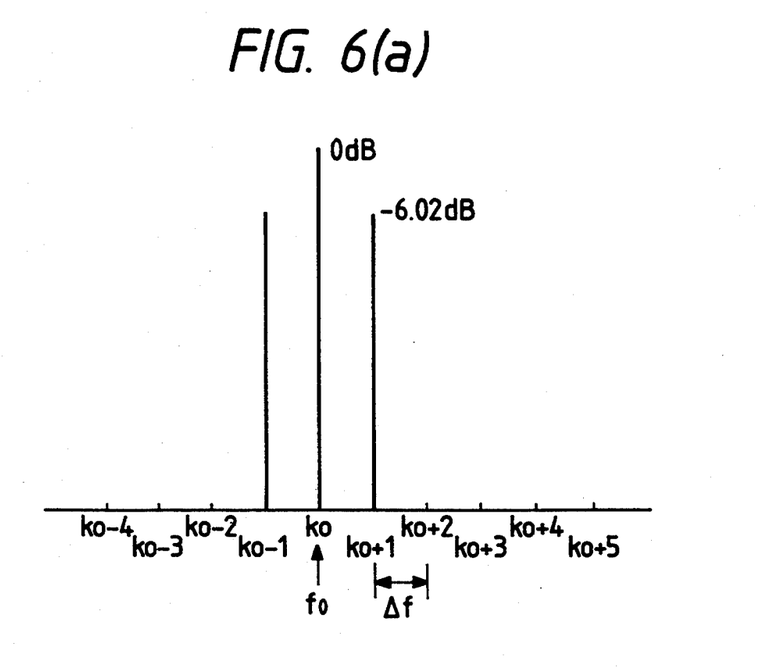
FIGS. 6(a) and 6(b) are diagrams showing an example of a spectrum in the case where a Hanning window is used.
Figure 6B:
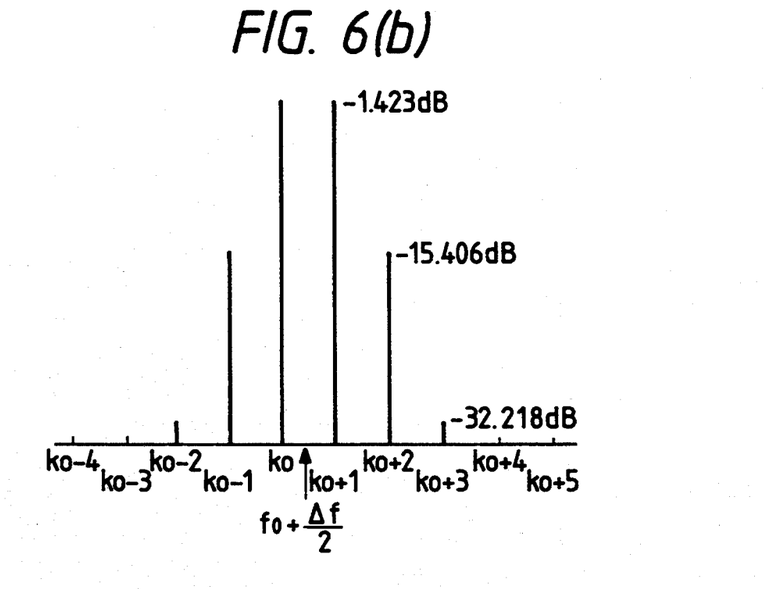

Further, in the case where the Hanning window is used as the window function, if the signal frequency f coincides with the frequency $f_0$ corresponding to the frequency point $k_0$, three spectral lines are observed as shown in FIG. 6(a). However, if $f=f_0+\Delta f/2$, then the signal frequency is dispersed into a larger number of the spectral lines as shown in FIG. 6(b), so that the amplitude of the spectrum at the frequency point $k_0$ is reduced to 85% (−1.4 dB) of the precise value.

Moreover, if the number of rotations of the rotating body (input signal frequency) fluctuates during an analysis period, the frequency spectrum of the input signal is dispersed into a still larger number of the spectral lines.

Since the conventional frequency spectrum analyzer displays only the amplitude of the spectrum at a specified frequency point, there is a problem in which the displayed values are reduced with large errors due to spectral dispersion caused by the above-mentioned leakage and fluctuations.

SUMMARY OF THE INVENTION

The present invention has been made to overcome the problem accompanying the conventional frequency spectrum analyzer. An object of the present invention is to provide a frequency spectrum analyzer capable of outputting or displaying an accurate spectral amplitude (amplitude spectrum) irrespective of the condition whether the frequency of an input signal coincides with frequency points aimed by the analyzer.

To achieve the above object, the present invention is applied to a frequency spectrum analyzer for multiplying digital data corresponding to an input signal by a window function, calculating a frequency spectrum of the input signal with Discrete Fourier Transform, and outputting or displaying the calculated result, wherein the frequency spectrum analyzer is provided with a amplitude calculating device for calculating the square root of the sum of the squares of amplitudes of a predetermined number of spectral lines close to a desired frequency; and the calculated value is outputted or displayed as a Root-Mean-Square value of the amplitude of the spectrum of the desired frequency.

In the above-mentioned frequency spectrum analyzer, the window function, subjected to multiplication by the digital data corresponding to the input signal, subjected to discrete Fourier transform, and used to calculate the spectrum of the frequency of the input signal, is provided with at least one function selected from suitable a rectangular window function, a Hanning window function, a Blackman window function and a Hamming window function.

With the frequency spectrum analyzer of the present invention, when a user specifies a predetermined frequency, the square root of the sum of the squares of the amplitudes of the predetermined number of spectral lines close to the predetermined frequency is calculated so that the calculated value is displayed or outputted as a Root-Mean-Square amplitude of the spectrum of the specified frequency.

DETAILED DESCRIPTION OF THE PREFERRED EMBODIMENT

An embodiment of the present invention will now be described with reference to the accompanying drawings.

Figure 1:
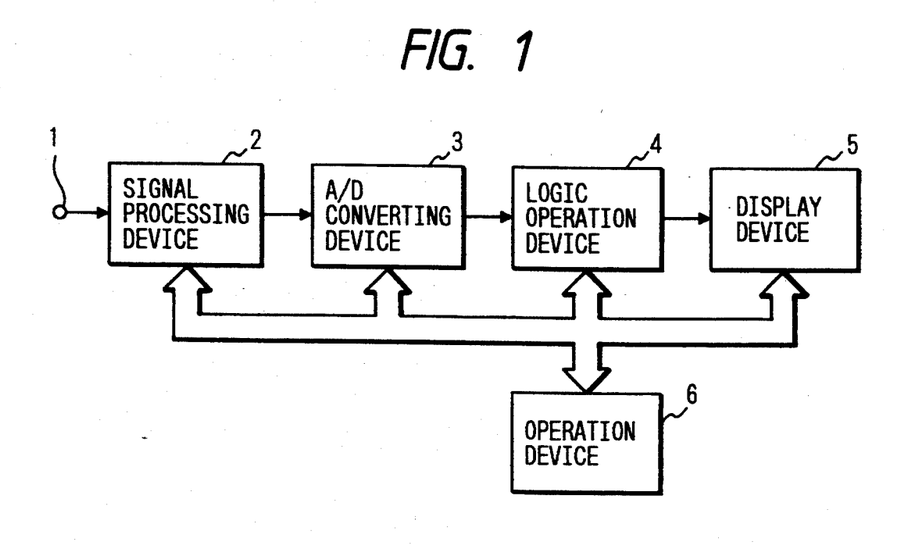
FIG. 1 is a block diagram showing a configuration of a frequency spectrum analyzer, which is an embodiment of the present invention.

FIG. 1 is a block diagram showing a general configuration of a frequency spectrum analyzer, which is an embodiment of the present invention. In FIG. 1, reference numeral 1 designates a signal input terminal to which an analog signal f(t) to be subjected to spectral analysis is inputted. The inputted signal f(t) is supplied to a signal processing device 2.

The signal processing device 2 adjusts the signal f(t) to an appropriate amplitude and frequency band and applies the thus adjusted signal to an A/D converting device 3. The A/D converting device 3 converts the input signal to digital data f(n) and delivers the digital data to a logic operation control device 4.

The logic operation control device 4 stores the received digital data f(n) in a memory; subjects the digital data to multiplication by a window function W(n), then to Discrete Fourier transform (DFT), and further to calculation of a Root-Mean-Square value (RMS) of a spectrum of a specified frequency; and supplies the logic operation results to a display device 5. The display device 5 displays the RMS value of the spectrum of the specified frequency.

The signal processing device 2, the A/D converting device 3, the logic operation control device 4, and the display device 5 are connected to an operation device 6, so that a user can set and display various parameters or the like interactively.

Figure 2:
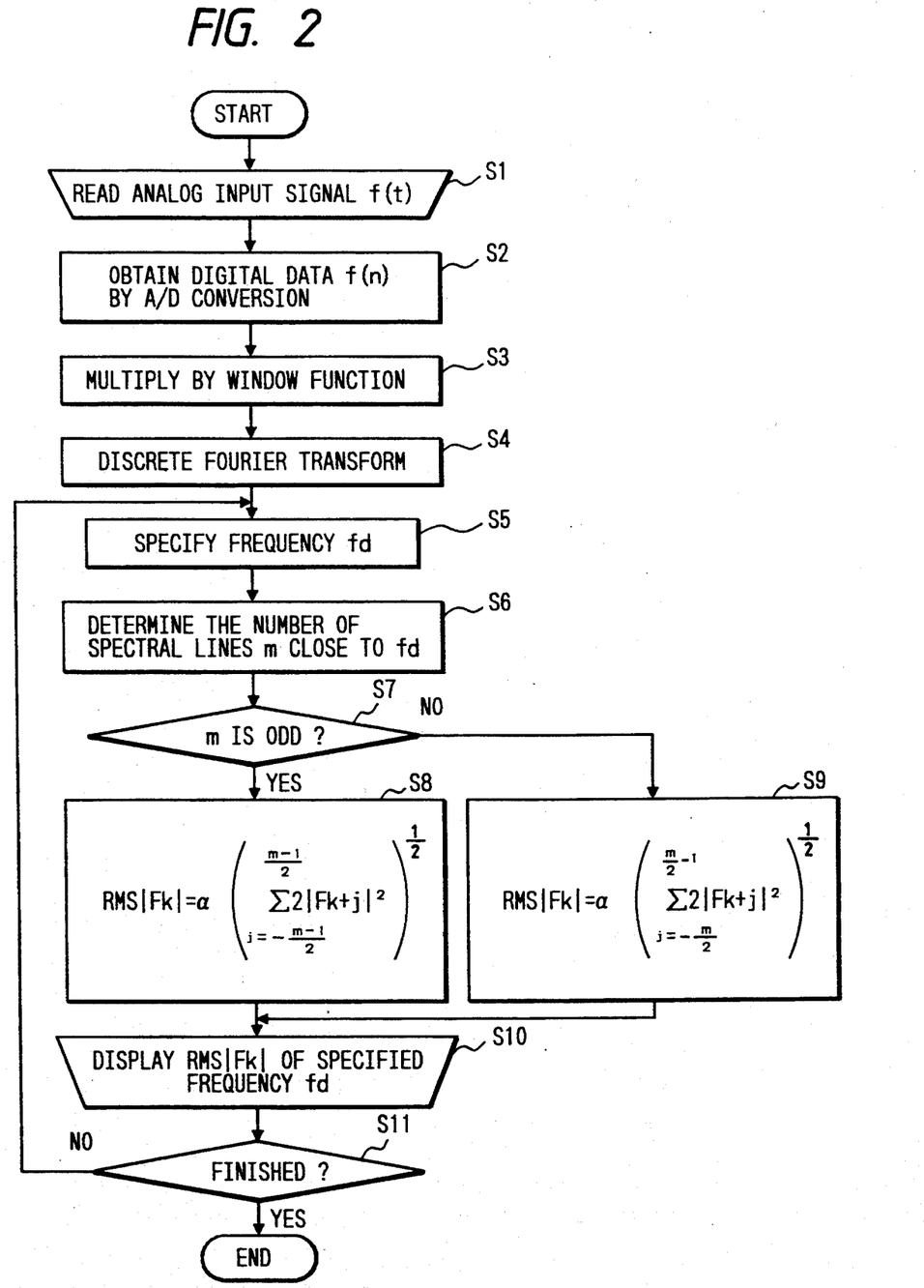
FIG. 2 is a flowchart illustrative of a processing procedure in the analyzer of FIG. 1.

An operation of the analyzer of the present invention will be described with reference to FIG. 2. FIG. 2 shows a processing procedure of the analyzer of FIG. 1 in flowchart form.

First, the analog input signal f(t) is read (Step S1), and then subjected to A/D conversion (Step S2) to obtain the digital data f(n). Subsequently, with the number of samples set to N, N pieces of data $\{f(n), n=0, 1, 2, \ldots, N-1\}$ are multiplied by the window function W(n) to obtain data $\{W(n) \cdot f(n), n=0, 1, 2, \ldots, N-1\}$ (Step S3).

The data $\{W(n) \cdot f(n), n=0, 1, 2, \ldots, N-1\}$ is subjected to DFT using the Fast Fourier Transform (FFT) to obtain complex number data $\{F(k), k=0, 1, \ldots, N-1\}$, from which an amplitude $2^{\frac{1}{2}}|F(k)|$ $(k=0, 1, \ldots, N/2-1)$ is calculated as a synthesized value of a positive frequency component and a negative frequency component (Step S4). This amplitude is usually expressed in decibel on the basis of a predetermined value (e.g., 1.0 V) as a reference.

A technique for displaying the result of an analysis by the conventional analyzer will be described before going on to Steps 5 to 10 in the present embodiment.

The conventional analyzer uses as a reference an amplitude obtained by multiplying a sinusoidal wave of a frequency coinciding with a discrete frequency point $k_0$ by a rectangular window function $\{W(n) = 1.0, n=0, 1, \ldots, N-1\}$, and makes an appropriate correction so that an amplitude obtained by a different window function (e.g., the Hanning window function) coincides with the reference.

For example, in the case of using a Hanning window, whose window function is defined by the following equation:

$$W(n) = \{1 - \cos(2\pi n/N), n=0, 1, \ldots, N-1\}$$

which is a function obtained by doubling the original Hanning window function, $\{\frac{1}{2} - \cos(2\pi n/N)/2\}$, the power spectrum (the square of an amplitude $2^{\frac{1}{2}}|F(k)|$) of a sinusoidal wave whose RMS value is 1.0 is expressed as:

$$2 \cdot |F(k)|^2 = \delta(k-k_0) + \frac{1}{4}\delta(k-k_0-1) + \frac{1}{4}\delta(k-k_0+1) \quad (1)$$

where $\delta$ is the Kronecker delta function in which $\delta(0)=1$, $\delta(m)=0$ $(m \neq 0)$. That is, $\delta$ in the first term of the right side, $(k-k_0)$, takes 1 when $k=k_0$, and 0 when $k \neq k_0$; $\delta$ in the second term, $(k-k_0-1)$, takes 1 when $k=k_0+1$, and 0 when $k \neq k_0+1$; $\delta$ in the third term, $(k-k_0+1)$, takes 1 when $k=k_0-1$, and 0 when $k \neq k_0-1$.

According to the above equation (1), $2^{\frac{1}{2}}|F(k_0)| = 1.0$ when $k=k_0$, which coincides with the amplitude 1.0 of the case where the rectangular window is used when $k=k_0$ (see FIG. 5(a) and FIG. 6(a)).

Therefore, in the case of using the Hanning window, the same amplitude as in the case of using the rectangular window can be obtained at the target frequency point $k_0$.

However, if the input signal frequency is varied only by a half ($\Delta f/2$) of an interval $\Delta f$ between the frequency points, the spectrum is broadened so that the display value at $k_0$ is reduced by 3.9 dB in the case of using the rectangular window, and that the display value is reduced by 1.423 dB in the case of using the Hanning window (see FIG. 5(b), FIG. 6(b)), thereby making both display values incoincident with each other.

To overcome this problem, the present embodiment is designed to display the square root of the sum of the squares of the amplitudes $2^{\frac{1}{2}}|Fk|$ of a plurality of frequency points close to a user's desired frequency fd as an amplitude RMS$|Fk|$ of the frequency fd.

Specifically, as shown in Steps S5 to S8 in FIG. 2, as the user specifies the desired frequency fd (Step S5); the number of spectral lines m close to fd to be added up is determined (Step S6); whether m is odd or not is judged (Step S7); if m is odd, then the amplitude RMS $|Fk|$ is calculated by the following equation (2) (Step S8); if, on the other hand, m is even, then the amplitude RMS $|Fk|$ is calculated by the following equation (3):

$$RMS|Fk| = \alpha \left( \sum_{j=-\frac{m-1}{2}}^{\frac{m-1}{2}} 2 \cdot |Fk+j|^2 \right)^{\frac{1}{2}} \quad (2)$$

$$RMS|Fk| = \alpha \left( \sum_{j=-\frac{m}{2}}^{\frac{m}{2}-1} 2 \cdot |Fk+j|^2 \right)^{\frac{1}{2}} \quad (3)$$

where k is the frequency point closest to the frequency fd, and $\alpha$ is the coefficient determined in accordance with the window function, which is 1.0 in the case of the rectangular window, and $(\frac{2}{3})^{\frac{1}{2}}$ in the case of the Hanning window.

According to the physical study of the DFT, the reason why the thus calculated RMS $|Fk|$ is displayed is that the RMS value of the sinusoidal wave of a frequency becomes equal to the square root of the sum of the squares $2|F(k)|^2$ of the amplitudes of the respective spectral lines because the spectrum close to the frequency is broadened due to leakage. That is, for example in FIG. 6(a), the RMS value when $f=f_0$ becomes equal to the square root of the sum of the squares of the amplitudes of three spectral lines close to $f_0$, whereas in FIG. 6(b), the RMS value when $f=f_0+\Delta f/2$ becomes equal to the square root of the sum of the squares of the amplitudes of a plurality of (e.g., 6) spectral lines close to $(f_0+\Delta f/2)$.

Figure 3A:
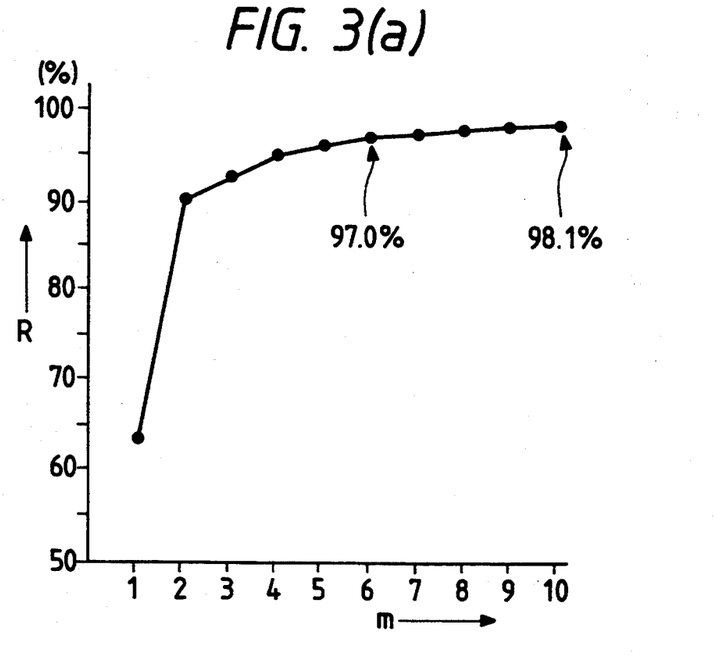
FIGS. 3(a) and 3(b) are diagrams showing the relationship between a number of spectral lines (m) for adding up the squares of the amplitudes and ratios (R) of calculated values to the true amplitudes of a specified frequency spectrum of an input signal.
Figure 3B:
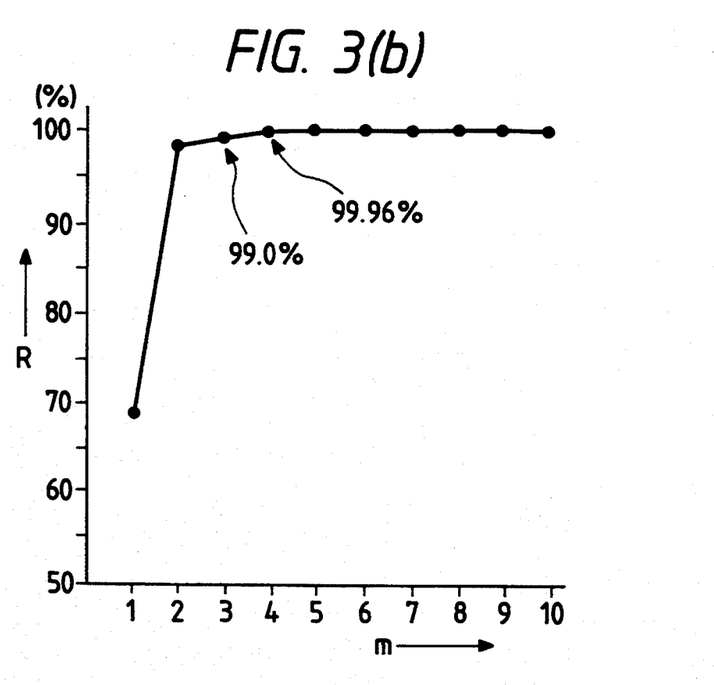

FIG. 3(b) shows a relationship between the number of spectral lines m to be added up in the case of FIG. 6(b) and the ratio R (%) of the RMS $|Fk|$ value calculated for the RMS value when $f=f_0+\Delta f/2$ by the equation (2) or (3). Here, the spectral lines are sequentially added up in the order of size. Since R=99.0% when m=3, and R=99.96% when m=4 as shown in FIG. 3(b), m may be set to 3 or 4 for practical applications, taking accuracy requirements into consideration. When $f=f_0$, R=100% with m being equal to 3 as is apparent from FIG. 6(a).

The spectral dispersion becomes maximized when the frequency of the input signal is varied by $\Delta f/2$ from $f_0$ as long as the frequency of the input signal does not fluctuate during analysis.

To calculate the ratio R from the decibels D of the amplitudes of the spectral lines shown in FIGS. 5(a) and 5(b), or FIGS. 6(a) and 6(b), the following equation (4) or (5) is employed:

$$R = \alpha \left( \sum_{j=-\frac{m-1}{2}}^{\frac{m-1}{2}} 10^{Dk+j/10} \right)^{\frac{1}{2}} \quad (m: \text{odd}) \quad (4)$$

$$R = \alpha \left( \sum_{j=-\frac{m}{2}}^{\frac{m}{2}-1} 10^{Dk+j/10} \right)^{\frac{1}{2}} \quad (m: \text{even}) \quad (5)$$

where $\alpha$, k, and m are the same as those in the equations (2) and (3).

A method of determining the coefficient $\alpha$ in the case of using the Hanning window will be described next.

If the window function $\{1-\cos(2\pi n/N)\}$ is used, the total power P of a sinusoidal wave is given as follows with reference to the equations (1) and (2).

$$P = 2\{|F(k_0-1)|^2 + |F(k_0)|^2 + |F(k_0+1)|^2\}$$
$$= 1/4 + 1 + 1/4 = 3/2$$

Since P must be equal to 1.0, it is understood that such a correction as to multiply P by $\frac{2}{3}$ in terms of power is necessary. Therefore, in terms of the RMS value, multiplication by $(\frac{2}{3})^{\frac{1}{2}}$ is necessary, which means that $\alpha$ is defined as $(\frac{2}{3})^{\frac{1}{2}}$.

The number of spectral lines m to be summed in the case of using the rectangular window as a window function will be examined next.

FIG. 5(b) shows a spectral distribution in the case where the input signal frequency f is varied to $f_0+\Delta f/2$, and FIG. 3(a) shows the relationship between the value m and the ratio R in this case. As is apparent from FIG. 3(a), R=97.0% when m=5, and R=98.1% when m=10. Thus, a significant improvement is exhibited with respect to the ratio R compared with the case of the conventional analyzer (R=64%).

As described above, the present invention is designed to display the value RMS $|Fk|$ calculated by the equations (2) or (3) using not only the number of spectral lines m to be defined in accordance with the window function and accuracy requirements but also the correction coefficient $\alpha$ to be defined in accordance with the window function. Therefore, even if the input signal frequency is varied, an accurate RMS value of a desired frequency can be displayed.

A method of evaluating a predetermined frequency component in the case where an input signal frequency fluctuates to a large degree during analysis (e.g., the number of rotations of a rotating machine subjected to the analysis fluctuates to a large degree due to load variations or requirement change) will be examined next.

Figure 4A:
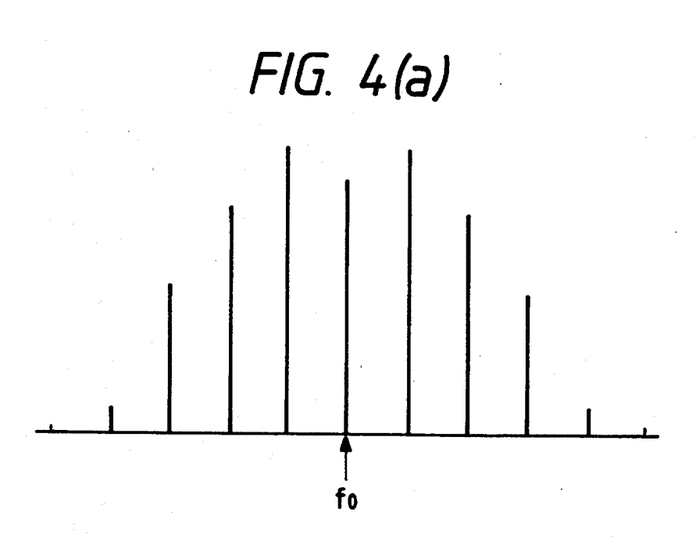
FIGS. 4(a) and 4(b) are diagrams showing an example of a spectrum in the case where a frequency of an input signal fluctuates during analysis.

If the input signal is varied during A/D conversion, for example, such a broadened spectrum as shown in FIG. 4(a) is obtained. In the case where an initially set frequency $f_0$ is varied to a frequency $f_0'$ that is different from $f_0$ due to a requirement change, such a spectrum as shown in FIG. 4(b) is obtained.

Figure 4B:
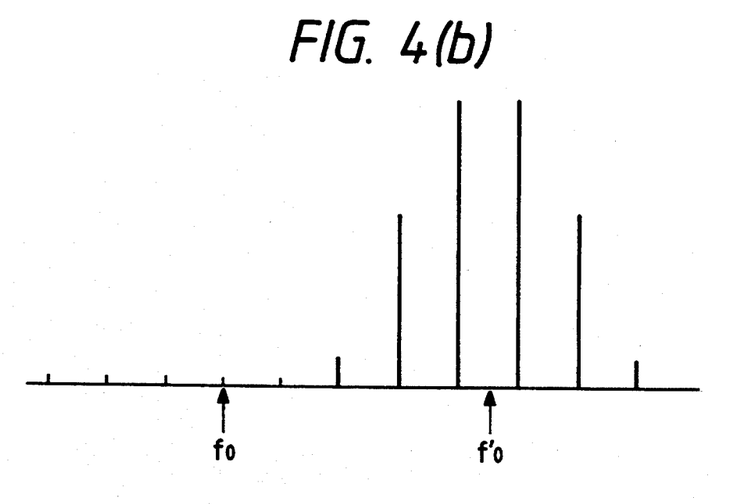

In the case of FIGS. 4(a) and 4(b), the value m, i.e., the number of spectral lines to be summed is determined in consideration of a frequency variation rate of the input signal, together with the window function to be used and the accuracy requirements. In other words, the larger the frequency variation rate is, the larger the dispersion of a spectrum becomes. It is for this reason that the value m is set to a large value.

Accordingly, even if the input signal frequency fluctuates during analysis, the RMS value of a predetermined frequency component can be displayed accurately.

While the spectral analysis result is displayed on the display device in the above embodiment, such result may be outputted to, e.g., a computer as digital data.

As described in the foregoing, the frequency spectrum analyzer of the present invention is characterized as calculating the square root of the sum of the squares of the amplitudes of a predetermined number of spectral lines close to a predetermined frequency when a user specifies the predetermined frequency, and outputting or displaying such calculated value as a Root-Mean-Square amplitude of the spectrum of the specified frequency. Therefore, even if the input signal frequency fluctuates, an accurate amplitude at a desired frequency can be obtained, hence allowing highly reliable measurements to be made.

What is claimed is:

1. A frequency spectrum analyzer comprising:
    digital data multiplying means for multiplying digital data corresponding to an input signal by a window function;
    frequency spectrum calculating means for calculating a frequency spectrum of said input signal using Discrete Fourier Transform;
    amplitude calculating means for calculating the square root of the sum of squares of amplitudes of a predetermined number of spectral lines close to a desired frequency; and
    outputting means for outputting a value calculated by said amplitude calculating means as a Root-Mean-Square value of said amplitudes of said spectral lines of said desired frequency.

2. The frequency spectrum analyzer of claim 1, wherein said Root-Mean-Square value of said amplitudes of said spectral lines calculated by said amplitude calculating means is obtained by both equations:

$$RMS|Fk| = \alpha \left( \sum_{j=-\frac{m-1}{2}}^{\frac{m-1}{2}} 2 \cdot |Fk+j|^2 \right)^{\frac{1}{2}}$$

when said predetermined number m of said spectral lines close to said desired frequency is odd; and $$RMS|Fk| = \alpha \left( \sum_{j=-\frac{m}{2}}^{\frac{m}{2}-1} 2 \cdot |Fk+j|^2 \right)^{\frac{1}{2}}$$

when said predetermined number m of said spectral lines close to said desired frequency is even;

where k is a frequency point closest to said desired frequency; $|Fk+j|$ and $|Fk|$ are amplitudes at frequency points k+j and k, respectively; and $\alpha$ is a coefficient determined in accordance with said window function.

3. The frequency spectrum analyzer of claim 1, wherein said window function, subjected to multiplication by said digital data corresponding to said input signal, then subjected to the Discrete Fourier Transform, and further used to calculate said spectrum of said frequency of said input signal, comprises at least one function selected from a rectangular window function, a Hanning window function, a Blackman window function and a Hamming window function.

* * * * *